US008765489B2

(12) United States Patent
Park et al.

(10) Patent No.: US 8,765,489 B2
(45) Date of Patent: Jul. 1, 2014

(54) SEMICONDUCTOR DEVICE AND METHOD FOR FABRICATING THE SAME

(75) Inventors: Jung Woo Park, Seoul (KR); Gil Jae Park, Busan (KR); Ki Seon Park, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 218 days.

(21) Appl. No.: 13/529,051

(22) Filed: Jun. 21, 2012

(65) Prior Publication Data

US 2013/0037896 A1 Feb. 14, 2013

(30) Foreign Application Priority Data

Aug. 9, 2011 (KR) ........................ 10-2011-0078972

(51) Int. Cl.
 H01L 21/00 (2006.01)
 H01L 29/82 (2006.01)
 G11C 11/00 (2006.01)
(52) U.S. Cl.
 USPC ................................ 438/3; 257/421; 365/158

(58) Field of Classification Search
 USPC ................................ 257/421; 438/3; 365/158
 See application file for complete search history.

(56) References Cited

U.S. PATENT DOCUMENTS

| 2003/0151079 | A1* | 8/2003 | Jones et al. | 257/295 |
| 2003/0170976 | A1* | 9/2003 | Molla et al. | 438/637 |
| 2005/0078510 | A1* | 4/2005 | Jeong et al. | 365/158 |
| 2005/0205952 | A1* | 9/2005 | Park et al. | 257/421 |
| 2011/0089511 | A1* | 4/2011 | Keshtbod et al. | 257/422 |

* cited by examiner

Primary Examiner — Karen Kusumakar
(74) Attorney, Agent, or Firm — IP & T Group LLP

(57) ABSTRACT

A method for fabricating a semiconductor device includes forming a magnetic tunnel junction (MTJ) element on a substrate, forming a first capping layer along the shape of the MTJ element, forming an insulating layer on the first capping layer, forming a trench exposing a portion of the first capping layer above the MTJ element by selectively etching the insulating layer, forming a second capping layer on sidewalls of the trench, removing the exposed portion of the first capping layer using the second capping layer as an etching mask to expose an upper surface of the MTJ element, and forming a conductive layer in the trench, wherein the conductive layer contacts the upper surface of the MTJ element.

5 Claims, 9 Drawing Sheets

SEMICONDUCTOR DEVICE AND METHOD FOR FABRICATING THE SAME

CROSS-REFERENCE(S) TO RELATED APPLICATIONS

The present application claims priority of Korean Patent Application No(s). 10-2011-0078972, filed on Aug. 9, 2011, which is incorporated herein by reference in its entirety.

BACKGROUND OF THE INVENTION

The present invention relates to a magnetic tunnel junction device and a memory device including the magnetic tunnel junction device, and more particularly, to a magnetic tunnel junction device capable of storing multi-bit data in a limited area and a magneto-resistance memory device including the magnetic tunnel junction device.

A dynamic random access memory (DRAM), which is a widely used semiconductor memory device, has advantages of high operation speed and high integration. However, the DRAM is a volatile memory device that loses data when a power supply is cut off, and the DRAM performs a refresh operation to prevent any loss of stored data. Meanwhile, a flash memory is a non-volatile memory device and may be highly integrated, but the flash memory has an uncompetitive operation speed. As compared with the DRAM and the flash memory, a magneto-resistance random memory device (MRAM) may have non-volatility, high operation speed, and high integration (scalability).

The MRAM device is a non-volatile memory device where data is stored by magnetic storage elements having different resistances according to a magnetic field between ferromagnetic plates. The magnetic storage element is a component including two ferromagnetic plates separated by an insulating layer. If polarities of the two ferromagnetic plates are parallel (the same), a resistance of magnetic storage element is minimized. Conversely, if polarities of the two ferromagnetic plates are opposite, the resistance is maximized. The MRAM device stores data based on cell's resistance, which changes according to the magnetization polarity of the ferromagnetic plates in the magnetic storage element. As a magnetic storage element, a Magnetic Tunnel Junction (MTJ element) may be used.

In the MRAM, the MTJ element may include a stacked structure of a ferromagnetic layer, an insulating layer, and another ferromagnetic layer. When electrons passing through a first ferromagnetic layer penetrate into an insulating layer serving as a tunneling barrier, the probability of an electron penetrating into the insulating layer is determined by the magnetic direction of second ferromagnetic layer. If two ferromagnetic layers have the same polarity (parallel magnetic direction), an amount of current tunneling into the insulating layer is maximized. Conversely, if two ferromagnetic layers have an opposite magnetic direction, an amount of current is minimized. For example, when a resistance recognized in response to the tunneling current is high, information stored in the MTJ element may have a logic level "1" (or "0"). If the resistance is low, information stored may have a logic level "0" (or "1"). In the MTJ, a first ferromagnetic layer is called a pinned layer because its polarity is set to particular value, and a second ferromagnetic layer is called a free layer because its polarity may be changed according to a magnetic field or a supplied current.

SUMMARY OF THE INVENTION

An embodiment of the present invention is directed to a method for fabricating a semiconductor device that increases process reliability.

In accordance with an embodiment of the present invention, a method for fabricating a semiconductor device includes forming a magnetic tunnel junction (MTJ) element on a substrate; forming a first capping layer along the shape of the MTJ element; forming an insulating layer on the first capping layer; forming a trench exposing a portion of the first capping layer above the MTJ element by selectively etching the insulating layer; forming a second capping layer on sidewalls of the trench; removing the exposed portion of the first capping layer using the second capping layer as an etching mask to expose an upper surface of the MTJ element; and forming a conductive layer in the trench, wherein the conductive layer contacts the upper surface of the MTJ element.

In accordance with another embodiment of the present invention, a method for fabricating a semiconductor device includes forming a magnetic tunnel junction (MTJ) element on a substrate; forming a hard mask pattern on the MTJ element; forming a first capping layer along the shape of the MTJ element and the hard mask pattern; forming a first insulating layer on the first capping layer; removing a portion of the first capping layer and a portion of the first insulating layer to expose a portion of the hard mask pattern arranged on the MTJ element; forming an upper conductive layer on the exposed hard mask; forming a second insulating layer on the upper conductive layer; selectively removing the second insulating layer to form a trench exposing a portion of the upper conductive layer; and forming a contact plug in the trench to contact the upper conductive layer.

In accordance with another embodiment of the present invention, a semiconductor device includes a magnetic tunnel junction (MTJ) element; a hard mask arranged on the MTJ element; a first insulating layer exposing a portion of the hard mask; an upper conductive layer arranged on the exposed portion of the hard mask; a second insulating layer arranged on the conductive layer; and a contact plug extending through the second insulating layer to contact the upper conductive layer.

In accordance with another embodiment of the present invention, a semiconductor device includes a magnetic tunnel junction (MTJ) element formed on a substrate; a capping layer arranged on the MTJ element; an insulating layer arranged on the capping layer; a trench extending through the capping layer and the insulating layer and exposing a portion of the MTJ element; a metal layer formed on sidewalls of the trench; and a conductive layer formed in the trench, wherein the conductive layer contacts the MTJ element

DESCRIPTION OF SPECIFIC EMBODIMENTS

Figure 1A:
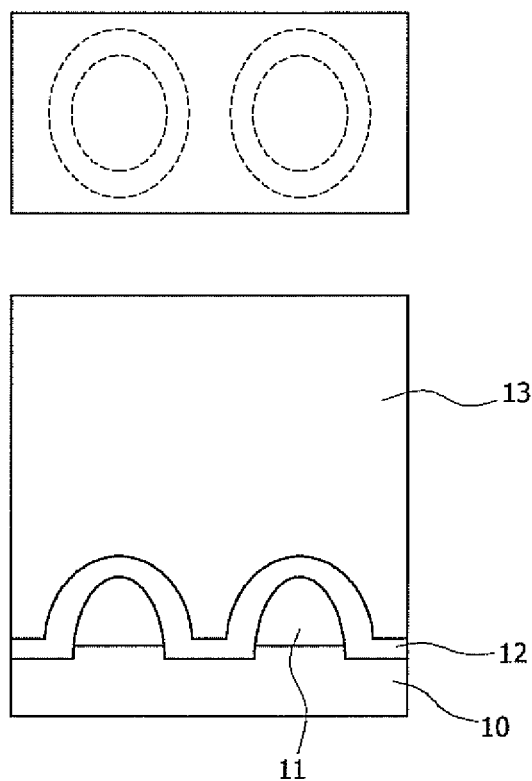
FIGS. 1A to 1G are a sectional view illustrating a method for fabricating a semiconductor device in accordance with a first embodiment of the present invention.

Exemplary embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIGS. 1A to 1G are a sectional view illustrating a method for fabricating a semiconductor device in accordance with a first embodiment of the present invention.

As shown in FIG. 1A, an MTJ Element 11 is formed on a substrate 10. A capping layer 12 is formed along the shape of the MTJ Element 11, and an insulating layer 13 is formed on the capping layer 12.

The MTJ element 11 includes a pinned layer, a tunnel insulating layer, and a free layer. The MTJ element 11 further includes various types of layers. The pinned layer 21 has a set polarity (i.e., magnetic direction). The free layer 23 has a magnetic direction that changes according to a direction of a supplied current corresponding to data. The pinned layer 21 may include a pinning plate and a pinned plate. In the first embodiment, the MTJ element may include electrodes.

The pinning plate, which sets a polarity of the pinned plate, includes an antiferromagnetic material. For example, the antiferromagnetic material includes at least one of material marked by chemical formulae of IrMn, PtMn, MnO, MnS, MnTe, $MnF_2$, $FeF_2$, $FeCl_2$, FeO, $CoCl_2$, CoO, $NiCl_2$, and NiO. The pinning plate may be formed in the shape of either a single layer including one of the antiferromagnetic materials, or a laminated layer of a plurality of antiferromagnetic materials.

The pinned layer and the free layer 23 include a ferromagnetic material. For example, the ferromagnetic material includes at least one of materials marked by chemical formulae of Fe, Co, Ni, Gd, Dy, NiFe, CoFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and $Y_3Fe_5O_{12}$.

The pinned layer and the free layer 23 may include a laminated layer of ruthenium and one of the ferromagnetic materials, e.g., a laminated layer of CdFe, Ru and CoFe. Further, the pinned layer and the free layer 23 may include a synthetic anti-ferromagnetic (SAF) layer having a sequentially laminated structure of a ferromagnetic layer, an anti-ferromagnetic coupling spacer layer, and a ferromagnetic layer. The tunnel insulating layer is used as a tunneling barrier between the pinned layer and the free layer 23. The tunnel insulating layer may include any material having an insulation characteristic. For example, the tunnel insulating layer may include a magnesium oxide layer (MgO).

Figure 1B:
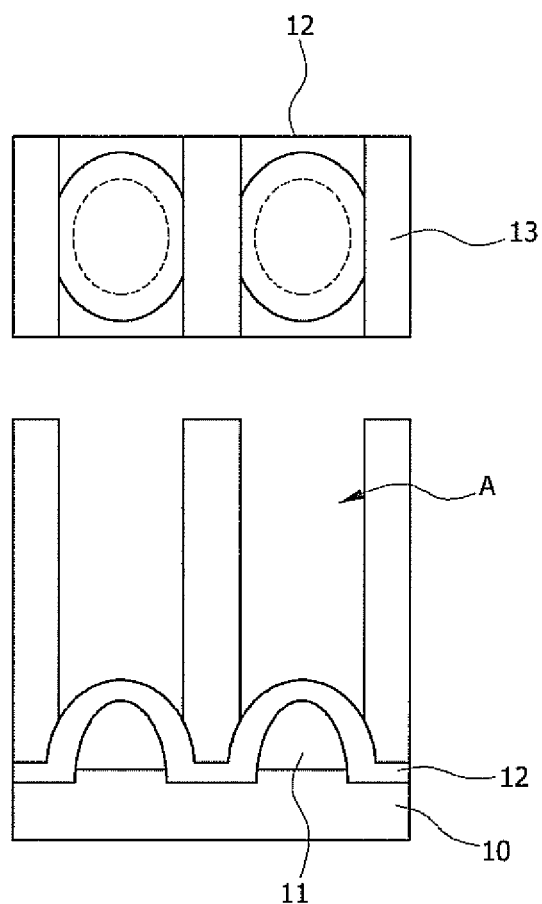

As shown in FIG. 1B, the insulating layer 13 is selectively etched and a trench A is formed exposing the capping layer 12. The capping layer 12 serves as a stop layer in an etching process.

Figure 1C:
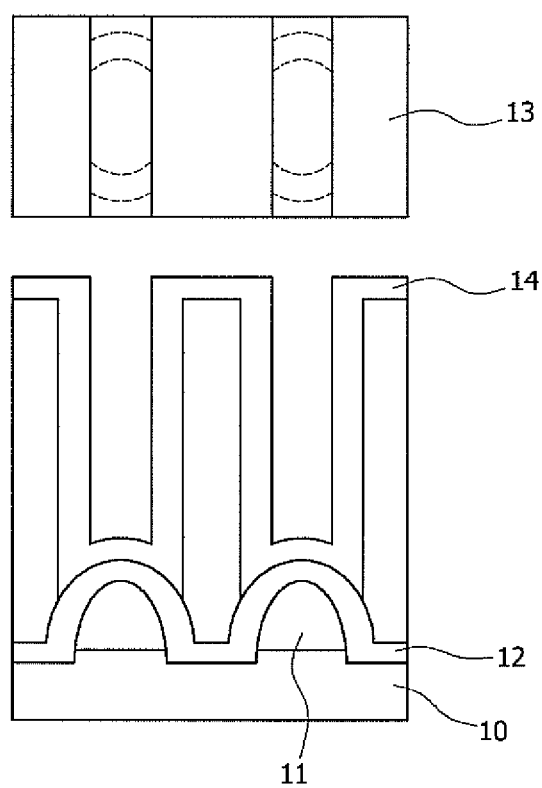

As shown in FIG. 1C, a metal layer 14 is formed along the shape of the trench A. More specifically, the metal layer 14 is formed on sidewalls and a bottom surface of the trench A. For instance, the metal layer 14 may include Ti/TiN or WN/W. The width of the metal layer 14 may be less than a half of the trench A.

Figure 1D:
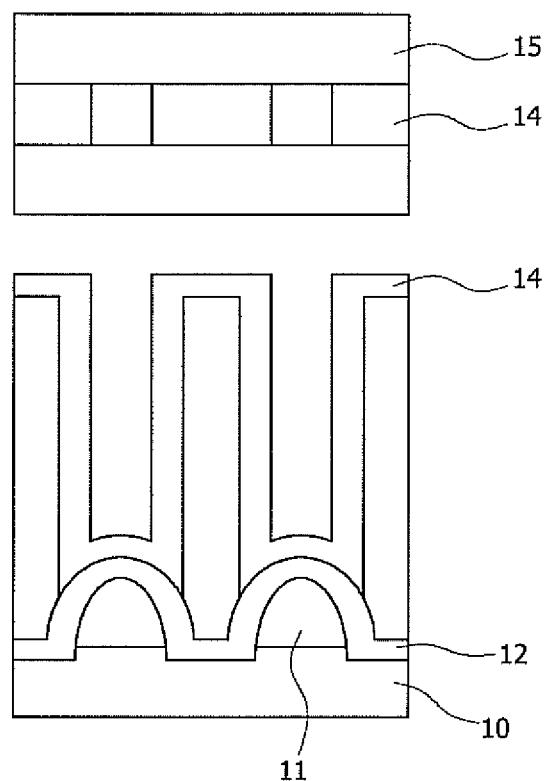

As shown in FIG. 1D, a photoresist pattern 15 is formed on the metal layer 14. The photoresist pattern 15 serves as a layer for protecting an area other than the trench A in a following process.

Figure 1E:
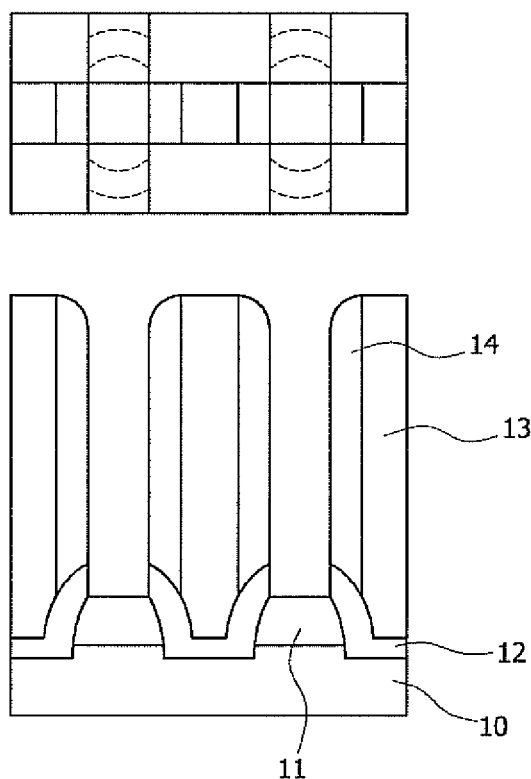

As shown in FIG. 1E, a portion of the metal layer on the upper surface of the MTJ element 11 is removed, and a portion of the capping layer 12 on the upper surface of the MTJ element 11 is also removed. As a result, the remaining metal is arranged on the sidewalls of the trench A, and the upper surface of the MTJ element 11 is exposed. Next, the photoresist pattern 15 is removed.

Figure 1F:
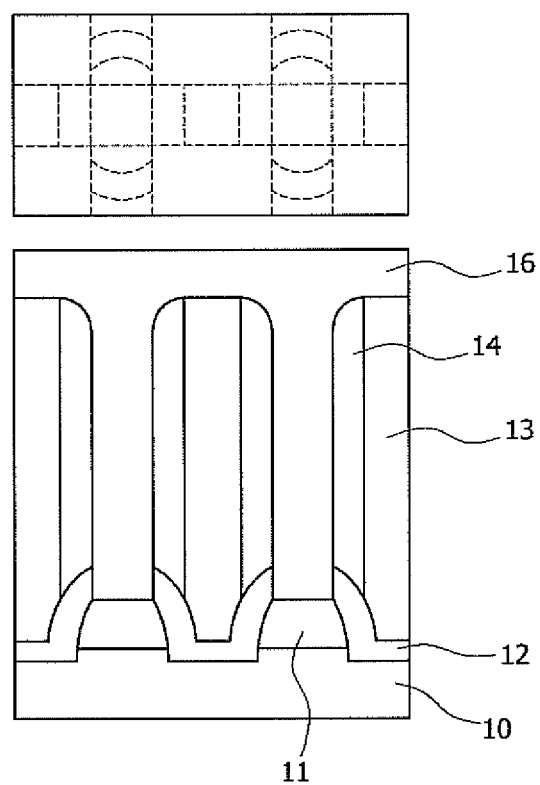

As shown in FIG. 1F, a conductive layer 16 is formed in the trench A and on the insulating layer 13.

Figure 1G:
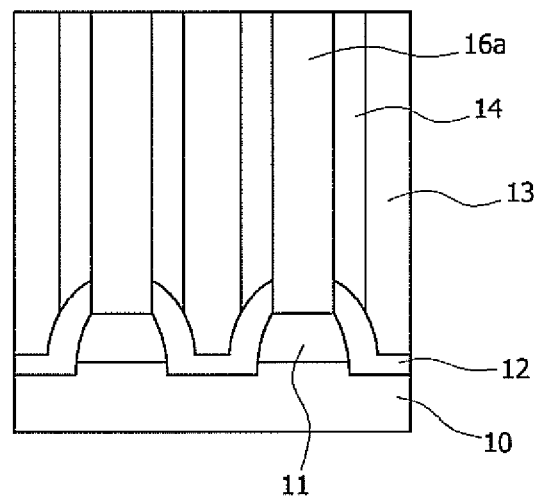

As shown in FIG. 1G, a portion of the conductive layer 16 on the insulating layer 13 is removed so that the insulating layer 13 is exposed, and subsequently, the conductive layer 16a remains in the trench A. A portion of the insulating layer 13 and a portion of the metal layer 14 may also be removed in the process to expose the insulating layer 13.

The upper surface of the MTJ element 11 is connected to the conductive layer 16a. As described above, the capping layer 12 is a layer protecting the upper surface of the MTJ element in the semiconductor manufacturing processes. A portion of the capping layer 12 is removed to expose the upper surface of the MTJ element 11. If a misaligned condition occurs in the process for making the trench A and removing the portion of the capping layer 12, the MTJ element 11 cannot be protected in subsequent semiconductor manufacturing processes. More specifically, the capping layer 12 on the side of the MTJ element 11 may be removed if a misaligned condition occurs, and thus, a side of the MTJ element 11 may be exposed. The exposed side of the MTJ element 11 may be damaged by the semiconductor manufacturing processes. Thus, the MTJ element 11 may not have high reliability.

However, the metal layer 14 is arranged on the side of the trench A in the method for fabricating a semiconductor device in accordance with the first embodiment of the present invention.

The capping layer 12 on the side of the MTJ element 11 is not removed because of the metal layer 14 in the process that removes the portion of the capping layer 12. More specifically, the metal layer 14 arranged on the sidewalls of the trench A protects the portion of the capping layer 12 on the side of the MTJ element 11. Also, the metal layer 14 serves as an etching mask in a process for exposing the upper area of the MTJ element 11. Since the side of the MTJ element 11 is not exposed, the MTJ element 11 is not damaged in any subsequent process.

A semiconductor device using a MTJ Element may use patterns less than 40 nm. A misaligned condition may easily occur in a process for exposing the upper area of the MTJ element 11 and connecting a conductive pattern to the MTJ element 11. More specifically, the side of the MTJ element 11 may be exposed and damaged. If conductive by-products generated in other semiconductor manufacturing processes are attached on the exposed surface of the MTJ element 11, a short circuit condition may occur.

Generally, an over etching process may be needed in a damascene technology. The damascene process may be used to connect the MTJ element 11 to an upper conductive layer. The metal layer 14 may protect the MTJ element 11 while the trench A is formed in the over etching process. Since the metal layer 14 keeps a side of the MTJ element 11 from being exposed, the MTJ element 11 maintains high reliability.

Also, the metal layer 14 enhances the align margin of the process for forming the trench A. Even if a misaligned condition happens, the metal layer 14 may protect the MTJ element 11.

As described above, if the side of the MTJ element is exposed in the semiconductor manufacturing process, the MTJ element may be damaged. To remove the defect, the present invention may include a manufacturing method for extending a hard mask pattern arranged on the MTJ element 11 by a non-electrolytic plating process. The hard mask pattern serves as an upper electrode and an etching mask for the MTJ element.

FIGS. 2A to 2D are a sectional view illustrating a method for fabricating a semiconductor device in accordance with another embodiment of the present invention.

Figure 2A:
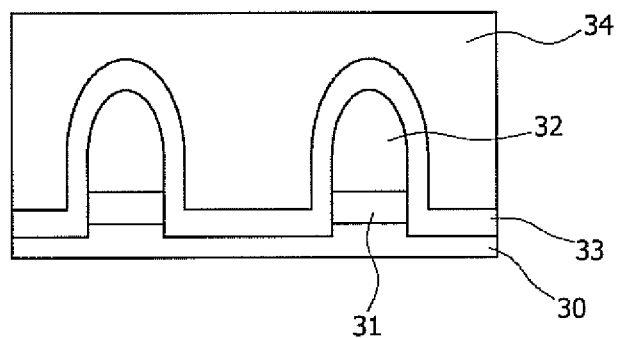
FIGS. 2A to 2D are a sectional view illustrating a method for fabricating a semiconductor device in accordance with a second embodiment of the present invention.

As shown in FIG. 2A, an MTJ element 31 is formed on a substrate 30, and a hard mask pattern 32 is formed on the MTJ element 31. In detail, a plurality of layers for the MTJ element 31 are formed on the substrate 30, and the hard mask pattern 32 is formed on the MTJ element 31. The plurality of layers are patterned when the hard mask pattern 32 serves as an etching mask. A side portion of the hard mask pattern 32 may be removed during the patterning process. The hard mask pattern 32 may include at least one selected from the group consisting of W/TiN, TiN, TaN, and W.

The MTJ element 31 includes a pinned layer, a tunnel insulating layer and a free layer. The MTJ element 11 further includes various types of layers. The pinned layer 21 has a set polarity (i.e., magnetic direction). The free layer 23 has a magnetic direction that changes according to a direction of a supplied current corresponding to data. The pinned layer 21 may include a pinning plate and a pinned plate. In the second embodiment, the MTJ element may include electrodes.

The pinning plate, which sets a polarity of the pinned plate, includes an antiferromagnetic material. For example, the antiferromagnetic material includes at least one of material marked by chemical formulae of IrMn, PtMn, MnO, MnS, MnTe, $MnF_2$, $FeF_2$, $FeCl_2$, FeO, $CoCl_2$, CoO, $NiCl_2$, and NiO. The pinning plate may be formed in the shape of either a single layer including one of the antiferromagnetic materials, or laminated layer of a plurality of antiferromagnetic materials.

The pinned layer and the free layer 23 include a ferromagnetic material. For example, the ferromagnetic material includes at least one of materials marked by chemical formulae of Fe, Co, Ni, Gd, Dy, NiFe, CoFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and $Y_3Fe_5O_{12}$.

The pinned layer and the free layer 23 may include a laminated layer of ruthenium and one of the ferromagnetic materials, e.g., a laminated layer of CdFe, Ru and CoFe. Further, the pinned layer and the free layer 23 may include a synthetic anti-ferromagnetic (SAF) layer having a sequentially laminated structure of a ferromagnetic layer, an anti-ferromagnetic coupling spacer layer, and a ferromagnetic layer. The tunnel insulating layer is used as a tunneling barrier between the pinned layer and the free layer 23. The tunnel insulating layer may include any material having an insulation characteristic. For example, the tunnel insulating layer may include a magnesium oxide layer (MgO).

A capping layer 32 is formed over the hard mask pattern 32 and the MTJ element 31. The capping layer 32 may include a silicon nitride layer. An insulating layer 34 is formed over the hard mask pattern 32 and the MTJ element 31.

Figure 2B:
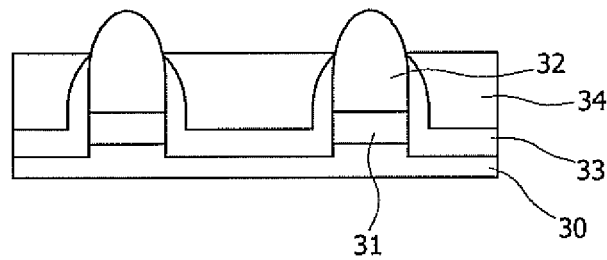

As shown in FIG. 2B, a chemical-mechanical planarization process is performed to expose the upper portion of the hard mask 32.

A portion of the insulation layer 34 is removed to keep the shape of the hard mask 32. In addition, a portion of the capping layer 32 is also removed if a slurry condition in the chemical-mechanical planarization process is adjusted.

Figure 2C:
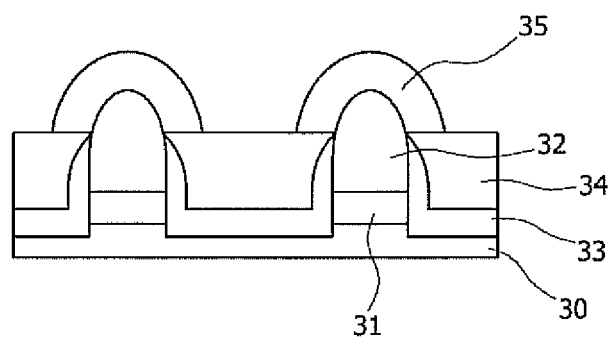

As shown in FIG. 2C, an upper metal layer 35 is formed on the exposed hard mask 32 by the non-electrolytic plating process using a seed element including Pd. The upper metal layer 35 may include a copper layer. A catalyzer including a $PdCl^2$ may be used in the non-electrolytic plating process. Also, the upper metal layer 35 is, for example, only arranged on the surface of the exposed hard mask 32 and not arranged on the insulating layer 34 between the exposed hard masks 32.

Figure 2D:
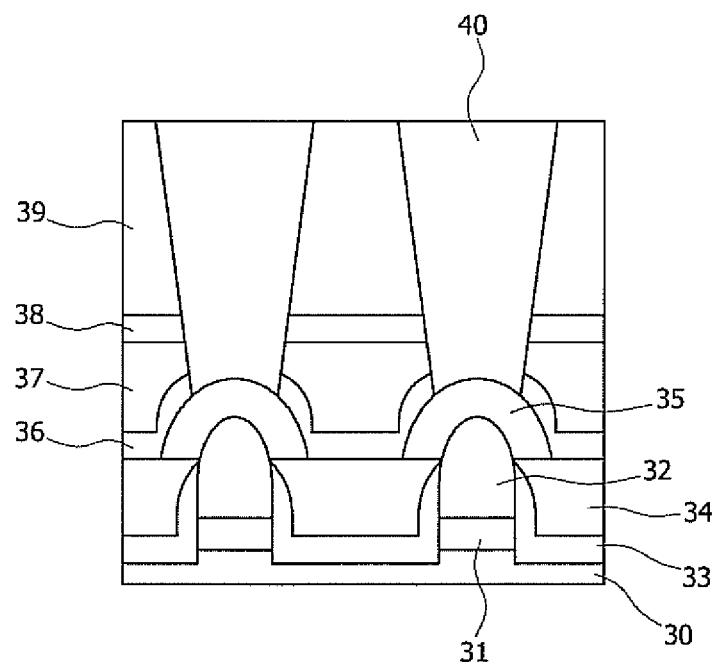

Shown in FIG. 2D, a capping layer 36 is formed on the upper metal layer, and an insulating layer 37 is formed on the capping layer 36. An etching stop layer 38 and an insulating layer 39 are stacked on the insulating layer 37.

A trench is formed by selectively etching the insulating layers 37 and 39 and the etching stop layer 38. A contact plug 40 is formed in the trench. A damascene process may be used for forming the contact plug 40. The contact plug 40 may include a copper plug. The etching stop layer 38 is a stop layer for etching the insulating layer 39. Also, a portion of the capping layer 36 arranged on the upper metal layer 35 is removed while making the trench.

If a misaligned condition occurs when selectively etching to form the trench for the contact plug 40, a side region of the MTJ element 31 may be exposed.

Even if the capping layer 33 is arranged to protect the MTJ element 31, the capping layer 33, which may be formed of a silicon nitride layer, may be removed when making the trench for the contact plug 40.

However, in the second embodiment of the present invention, since the upper metal layer 35 is arranged on the hard mask 32, a misaligned condition may expose a portion of the upper metal layer 35, but the misaligned condition does not expose the side of the MTJ element 31. The exposed portion of the upper metal layer 35 is not removed while making the trench for the contact plug 40.

As a result, a process margin for making the contact plug 40 may be effectively enhanced since the upper metal layer extends a surface of an upper conductive layer arranged on the MTJ element 31.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, comprising:
   forming a magnetic tunnel junction (MTJ) element on a substrate;
   forming a first capping layer along the shape of the MTJ element;
   forming an insulating layer on the first capping layer;
   forming a trench exposing a portion of the first capping layer above the MTJ element by selectively etching the insulating layer;
   forming a second capping layer on sidewalls of the trench;
   removing the exposed portion of the first capping layer using the second capping layer as an etching mask to expose an upper surface of the MTJ element; and
   forming a conductive layer in the trench, wherein the conductive layer contacts the upper surface of the MTJ element.

2. The method according to claim 1, wherein the width of the second capping layer is less than the half of the width of the trench.

3. The method according to claim 1, wherein the second capping layer includes a metal layer.

4. The method according to claim 1, wherein the second capping layer includes Ti/TIN or WN/W.

5. The method according to claim 1, wherein the first capping layer includes a silicon nitride.

* * * * *